US008940588B2

(12) United States Patent  
Gauthier, Jr. et al.

(10) Patent No.: US 8,940,588 B2
(45) Date of Patent: Jan. 27, 2015

(54) BULK FINFET ESD DEVICES (71) Applicant: International Business Machines Corporation, Armonk, NY (US)

(72) Inventors: Robert J. Gauthier, Jr., Hinesburg, VT (US); Tom C. Lee, Essex Junction, VT (US); Junjun Li, Williston, VT (US); Souvick Mitra, Essex Junction, VT (US); Christopher Stephen Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/450,612

(22) Filed: Aug. 4, 2014

(65) Prior Publication Data

US 2014/0342510 A1   Nov. 20, 2014

Related U.S. Application Data (62) Division of application No. 13/690,179, filed on Nov. 30, 2012.

(51) Int. Cl.
*H01L 21/332* (2006.01)
*H01L 21/76* (2006.01)
*H01L 21/8249* (2006.01)
(Continued)

(52) U.S. Cl.
CPC ........ *H01L 21/8249* (2013.01); *H01L 27/0255* (2013.01); *H01L 27/0251* (2013.01); *H01L 27/0266* (2013.01); *H01L 29/6609* (2013.01); *H01L 29/66371* (2013.01); *H01L 29/66795* (2013.01); *H01L 21/823431* (2013.01)

USPC 438/133; 438/424; 257/E21.35; 257/E21.388

(58) Field of Classification Search
CPC ............ H01L 27/0288; H01L 27/0886; H01L 27/0924
USPC .............. 257/355, E21.35, E21.388; 438/133
See application file for complete search history.

(56) References Cited

U.S. PATENT DOCUMENTS 6,433,609 B1   8/2002   Voldman
7,173,310 B2   2/2007   Voldman et al.
(Continued)

FOREIGN PATENT DOCUMENTS

JP   2010067635 A   3/2010

OTHER PUBLICATIONS

Thijs et al., "ESD Protection in FINFET Technologies" IEEE, 2011.
(Continued)

*Primary Examiner* — Lex Malsawma
(74) *Attorney, Agent, or Firm* — Michael J. LeStrange; Hoffman Warnick LLC (57) ABSTRACT Aspects of the disclosure provide a dual electrostatic discharge (ESD) protection device in fin field effect transistor (FinFET) process technology and methods of forming the same. In one embodiment, the dual ESD protection device includes: a bulk silicon substrate; a shallow trench isolation (STI) region formed over the bulk silicon substrate; a first ESD device positioned above the STI region; and a second ESD device positioned below the STI region, wherein the first ESD device conducts current above the STI region and the second ESD device conducts current below the STI region.

10 Claims, 8 Drawing Sheets

(51) Int. Cl.
  *H01L 27/02* (2006.01)
  *H01L 29/66* (2006.01)
  *H01L 21/8234* (2006.01)

(56) References Cited

U.S. PATENT DOCUMENTS

| | | | |
|---|---|---|---|
| 7,687,859 B2 | 3/2010 | Russ et al. | |
| 7,700,449 B2 | 4/2010 | Lee | |
| 7,919,816 B2 | 4/2011 | Gossner et al. | |
| 7,923,266 B2 | 4/2011 | Thijs et al. | |
| 7,964,893 B2 | 6/2011 | Lee | |
| 8,551,841 B2 | 10/2013 | Lee et al. | |
| 8,604,548 B2 | 12/2013 | Wang et al. | |
| 8,609,499 B2 | 12/2013 | Ho et al. | |
| 8,779,517 B2 * | 7/2014 | Lin et al. | 257/355 |
| 2002/0173098 A1 * | 11/2002 | Tang et al. | 438/255 |
| 2004/0052020 A1 * | 3/2004 | Ker et al. | 361/56 |
| 2006/0084212 A1 | 4/2006 | Anderson et al. | |
| 2007/0262386 A1 | 11/2007 | Gossner et al. | |
| 2007/0267700 A1 | 11/2007 | Russ et al. | |
| 2009/0315112 A1 | 12/2009 | Lee | |
| 2010/0155776 A1 | 6/2010 | Lee | |
| 2010/0296213 A1 | 11/2010 | Lee et al. | |
| 2011/0051300 A1 * | 3/2011 | Thijs et al. | 361/56 |
| 2014/0065794 A1 * | 3/2014 | Kar et al. | 438/424 |

OTHER PUBLICATIONS

Thijs et al, Characterization and Optimization of Sub-32-nm FinFET Devices for ESD Applications, IEEE Transactions on Electron Devices, vol. 55, Dec. 2008.

Gossner et al, "Novel Devices in ESD Protection", IEEE, 2007.

Thijs et al, "On Gated Diodes for ESD Protection in Bulk FinFET CMOS Technology", Sep. 2011.

Malsawma, Office Action Communication for U.S. Appl. No. 13/690,179 dated Apr. 24, 2014, 13 pages.

Malsawma, Notice of Allowance and Fee(s) Due for U.S. Appl. No. 13/690,179 dated Jul. 8, 2014, 7 pages.

* cited by examiner

BULK FINFET ESD DEVICES

FIELD OF THE INVENTION

The disclosure relates generally to semiconductor devices, and more particularly, to a dual electrostatic discharge (ESD) protection device in fin field effect transistor (FinFET) process technology and methods of forming the same.

BACKGROUND

In manufacturing multi-gate field effect transistors (FETs) that include a plurality of fin structures (i.e., a FinFET), electrostatic discharge (ESD) protection devices are often required. However, passive devices that are used for ESD protection are difficult to build on FinFET structures. Passive devices have a preference towards planar silicon regions, which are not usually available in FinFET structures.

BRIEF SUMMARY

Aspects of the disclosure provide a dual electrostatic discharge (ESD) protection device in fin field effect transistor (FinFET) process technology and methods of forming the same. In one embodiment, the dual ESD protection device includes: a bulk silicon substrate; a shallow trench isolation (STI) region formed over the bulk silicon substrate; a first ESD device positioned above the STI region; and a second ESD device positioned below the STI region, wherein the first ESD device conducts current above the STI region and the second ESD device conducts current below the STI region.

A first aspect of the disclosure provides a dual electrostatic discharge (ESD) protection device in fin field effect transistor (FinFET) process technology, comprising: a bulk silicon substrate; a shallow trench isolation (STI) region formed over the bulk silicon substrate; a first ESD device positioned above the STI region; and a second ESD device positioned below the STI region, wherein the first ESD device conducts current above the STI region and the second ESD device conducts current below the STI region.

A second aspect of the disclosure provides a method of manufacturing a dual ESD protection device in fin field effect transistor (FinFET) process technology, the method comprising: providing a bulk silicon wafer substrate; forming a plurality of fins on a top portion of the bulk silicon wafer substrate; forming an oxide isolation region between each of the fins, the oxide isolation region including a shallow trench isolation (STI); performing a selective epitaxial growth process to merge a portion of the plurality of fins; and patterning, etching, and implanting the portion of the plurality of fins to form the dual ESD protection device including: a first ESD device positioned above the oxide isolation region; and a second ESD device positioned below the oxide isolation region, wherein the first ESD device conducts current above the STI region and the second ESD device conducts current below the oxide isolation region.

BRIEF DESCRIPTION OF THE DRAWINGS

The above and other aspects, features and advantages of the disclosure will be better understood by reading the following more particular description of the disclosure in conjunction with the accompanying drawings.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

As mentioned above, the disclosure relates generally to semiconductor devices, and more particularly, to a multi-gate field effect transistor (FET) formed on a bulk substrate that includes an isolated fin structure and methods of forming the same.

In manufacturing multi-gate field effect transistors (FETs) that include a plurality of fin structures (i.e., a FinFET), electrostatic discharge (ESD) protection devices are often required. However, passive devices that are used for ESD protection are difficult to build on FinFET structures. Passive devices have a preference towards planar silicon regions, which are not usually available in FinFET structures. Therefore, it is desired to be able to manufacture a FinFET structure including at least one ESD protection device.

Figure 1:
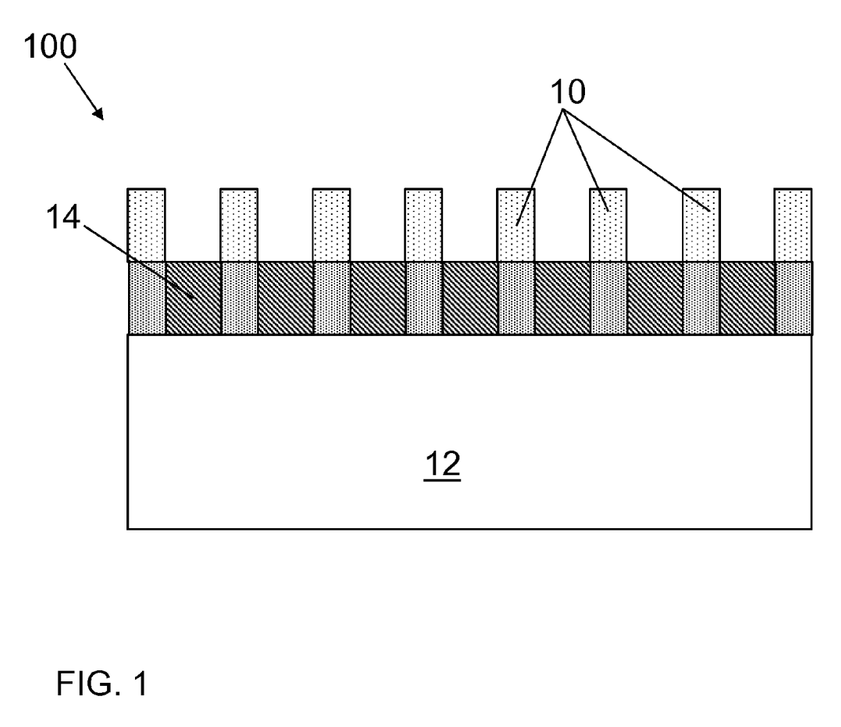
FIG. 1 shows a cross-sectional view of a conventional fin field effect transistor.

Turning now to FIG. 1, a cross-sectional view of a conventional FinFET transistor 100 is shown. It is understood that, using standard FinFET manufacturing technology, a plurality of fins 10 are formed above a bulk silicon substrate 12. Between each fin 10 is a shallow trench isolation (STI) region 14. As mentioned above, a passive ESD device cannot be built on top of the plurality of fins 10.

Aspects of the disclosure provide a dual electrostatic discharge (ESD) protection device in fin field effect transistor (FinFET) process technology and methods of forming the same. In one embodiment, the dual ESD protection device includes: a bulk silicon substrate; a shallow trench isolation (STI) region formed over the bulk silicon substrate; a first ESD device positioned above the STI region; and a second ESD device positioned below the STI region, wherein the first ESD device conducts current above the STI region and the second ESD device conducts current below the STI region.

Figure 2:
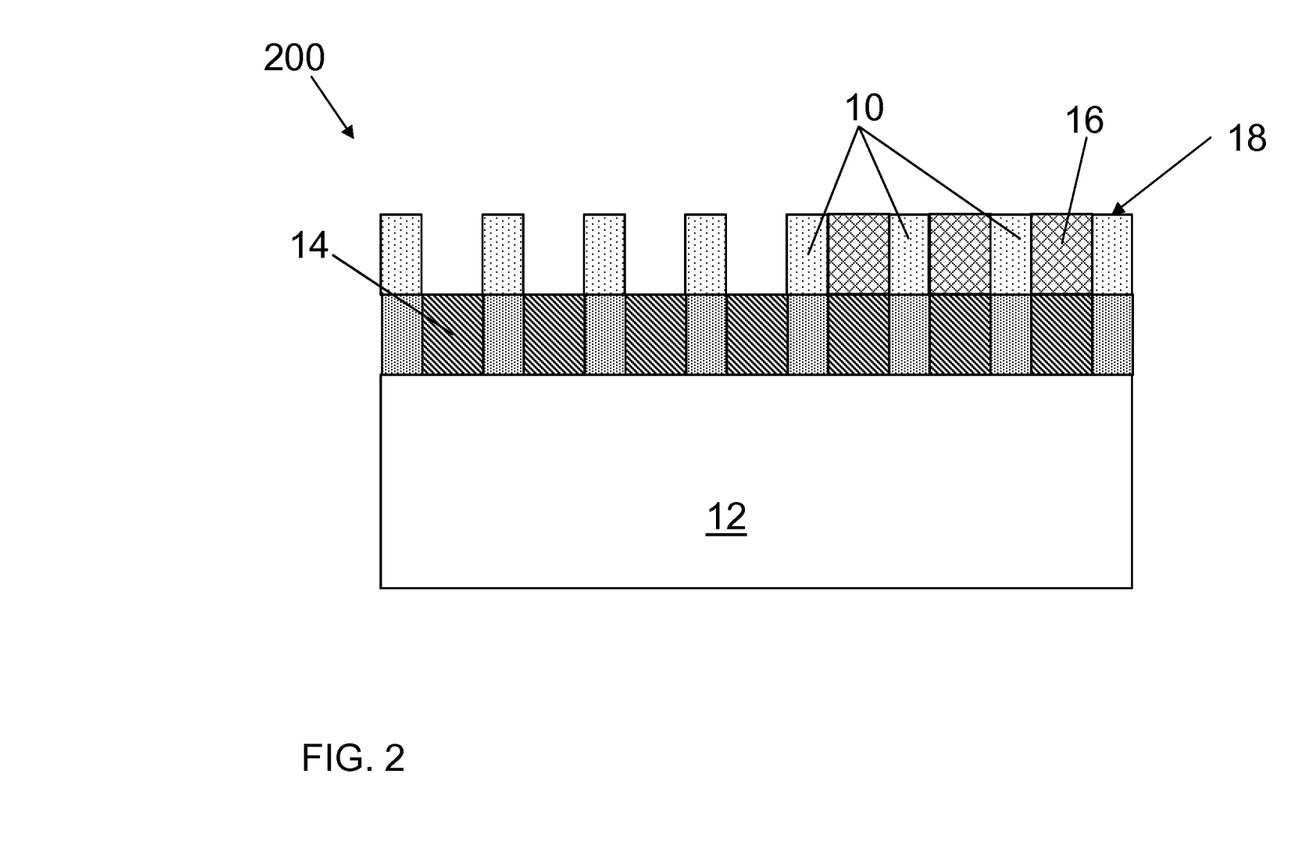
FIG. 2 shows a cross-sectional view of a fin field effect transistor according to embodiments of the invention.

Turning now to FIG. 2, a cross-sectional view of a FinFET transistor 200 according to embodiments of the invention is shown. Between the plurality of fins 10, a silicon portion 16 is formed. Silicon portion 16 may be formed using, for example, a selective epitaxial growth process, as known in the art. The silicon portion 16 merges the plurality of fins 10 to create a planar surface 18 in an area where it is desired to have a passive ESD device. Although not shown, if more silicon is desired on the planar surface 18 (i.e., in order to dissipate heat), a further selective epitaxial growth process may be performed. Once the planar surface 18 has been created, patterning, etching, and implanting, as known in the art, may be performed in order to form at least one ESD device on the planar surface 18. Standard patterning, etching, and implanting may also be performed to form FinFET devices in the non-planar region.

Figure 3A:
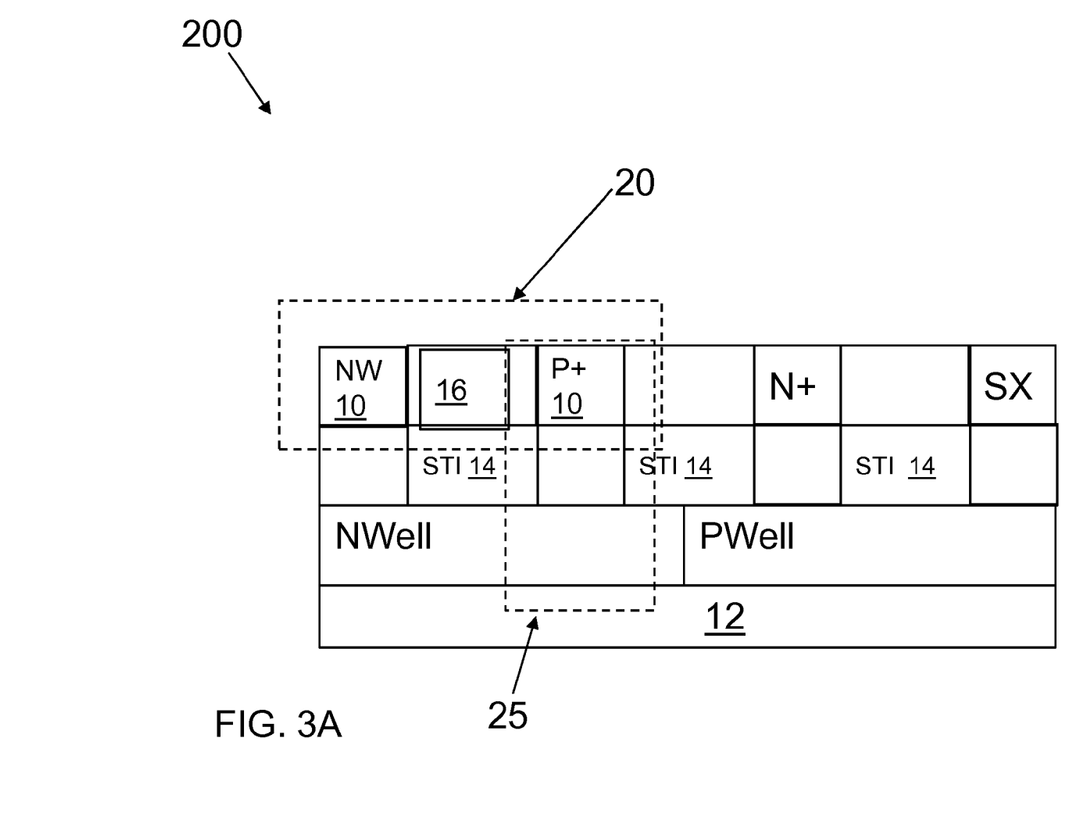
FIG. 3A shows a cross-sectional view of a fin field effect transistor including at least one ESD device according to embodiments of the invention.
Figure 3B:
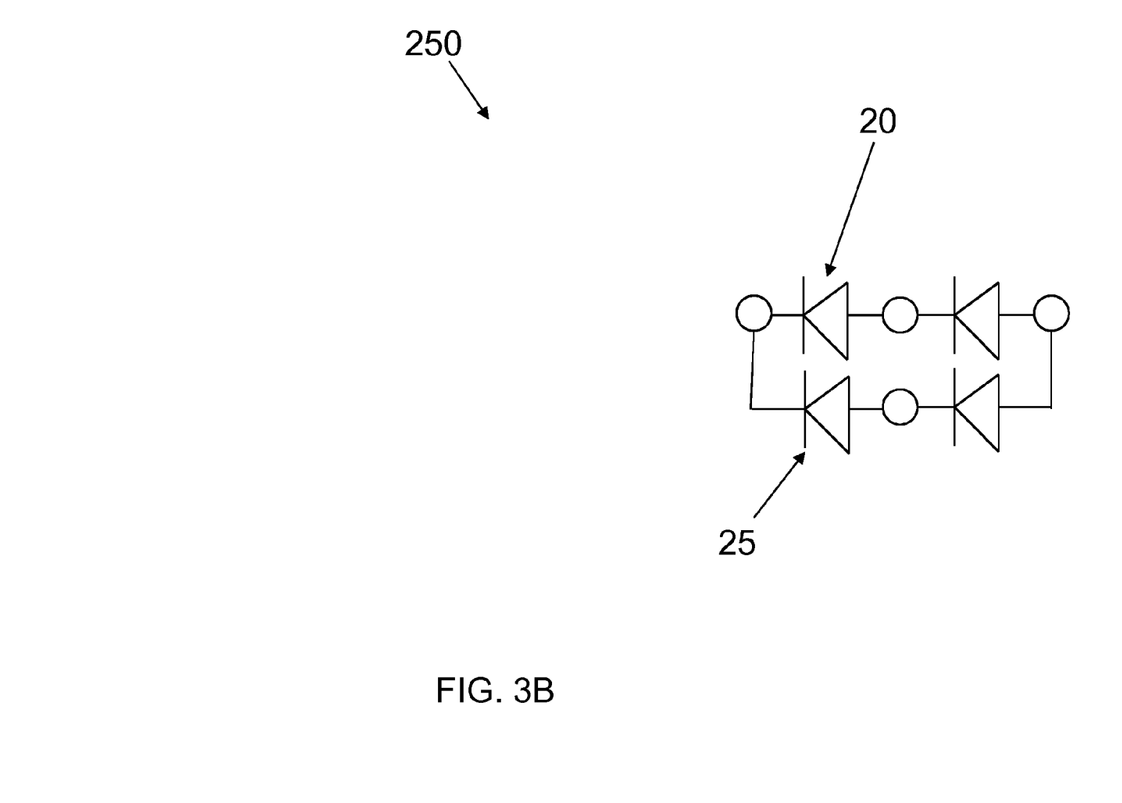
FIG. 3B shows a schematic diagram of a fin field effect transistor including at least one ESD device according to embodiments of the invention.

Turning now to FIG. 3A, a cross-sectional view of a Fin-FET 200 including at least one ESD device according to embodiments of the invention is shown. It is understood that only the planar surface 18 (FIG. 2) portion of FinFET 200 is shown for clarity purposes. That is, fins 10 may be implanted to be an NW region, or a p+ region. Further, a portion of the bulk silicon substrate 12 may be implanted as an NWell region. In this embodiment, FinFET 200 includes a dual ESD protection device. A first ESD protection device 20 is positioned above the STI region 14. For example, in FIG. 3A, the first ESD device 20 is a lateral device and is a pn junction diode (from the p+ region to the NW region). A second ESD device 25 is provided below the STI region 14 and is also a pn junction diode (from p+ region to NWell region). As seen in the schematic diagram of FinFET 200 shown in FIG. 3B, a dual ESD protection device 250 is formed by the first ESD device 20 and the second ESD device 25.

Figure 4A:
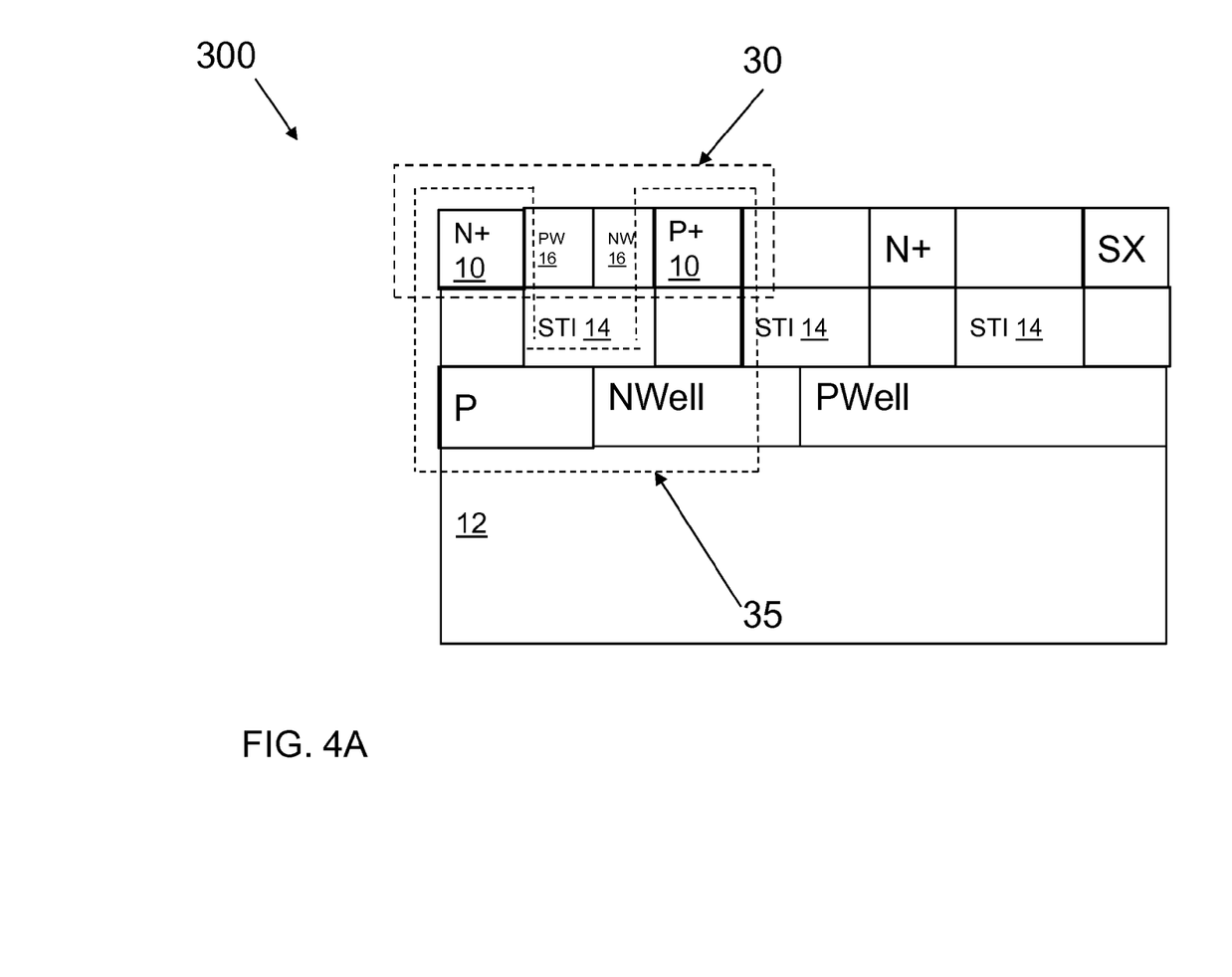
FIG. 4A shows a cross-sectional view of a fin field effect transistor including at least one ESD device according to embodiments of the invention.
Figure 4B:
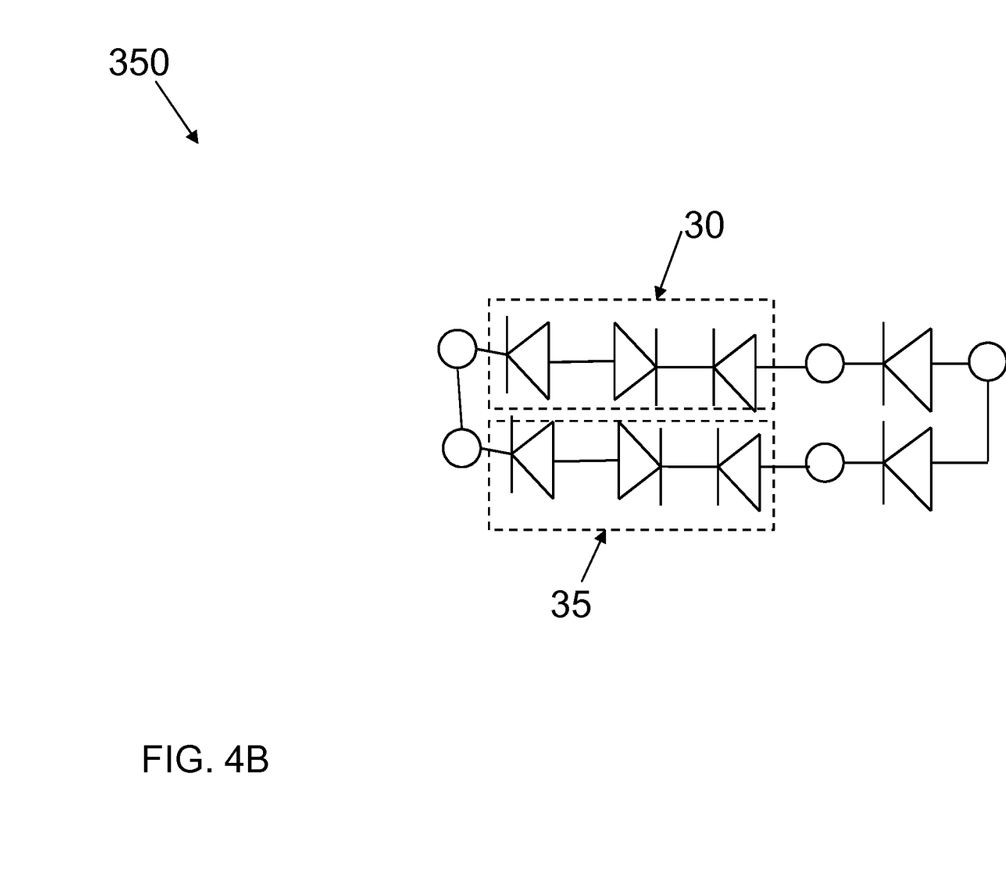
FIG. 4B shows a schematic diagram of a fin field effect transistor including at least one ESD device according to embodiments of the invention.

Turning now to FIG. 4A, a cross-sectional view of a Fin-FET 300 including at least one ESD device according to embodiments of the invention is shown. It is understood that only the planar surface 18 (FIG. 2) portion of FinFET 300 is shown for clarity purposes. That is, fins 10 may be implanted as an n+ and a p+ region, while the silicon portion 16 that merges fins 10 together may be partially implanted as a PW region and partially implanted as an NW region. Further, a portion of the bulk silicon substrate 12 may be appropriately implanted. In this embodiment, FinFET 300 also includes a dual ESD protection device. A first ESD protection device 30 is positioned above the STI region 14. For example, in FIG. 4A, the first ESD device 30 is a lateral device and is a thyristor formed by a pnpn junction (from the p+ region to the NW region to the PW region to the n+ region). A second ESD device 35 is provided below the STI region 14 and is also a thyristor formed by a pnpn junction (from p+ region to NWell region to P region to n+ region). As seen in the schematic diagram of FinFET 300 shown in FIG. 4B, a dual ESD protection device 350 is formed by the first ESD device 30 and the second ESD device 35.

Figure 5A:
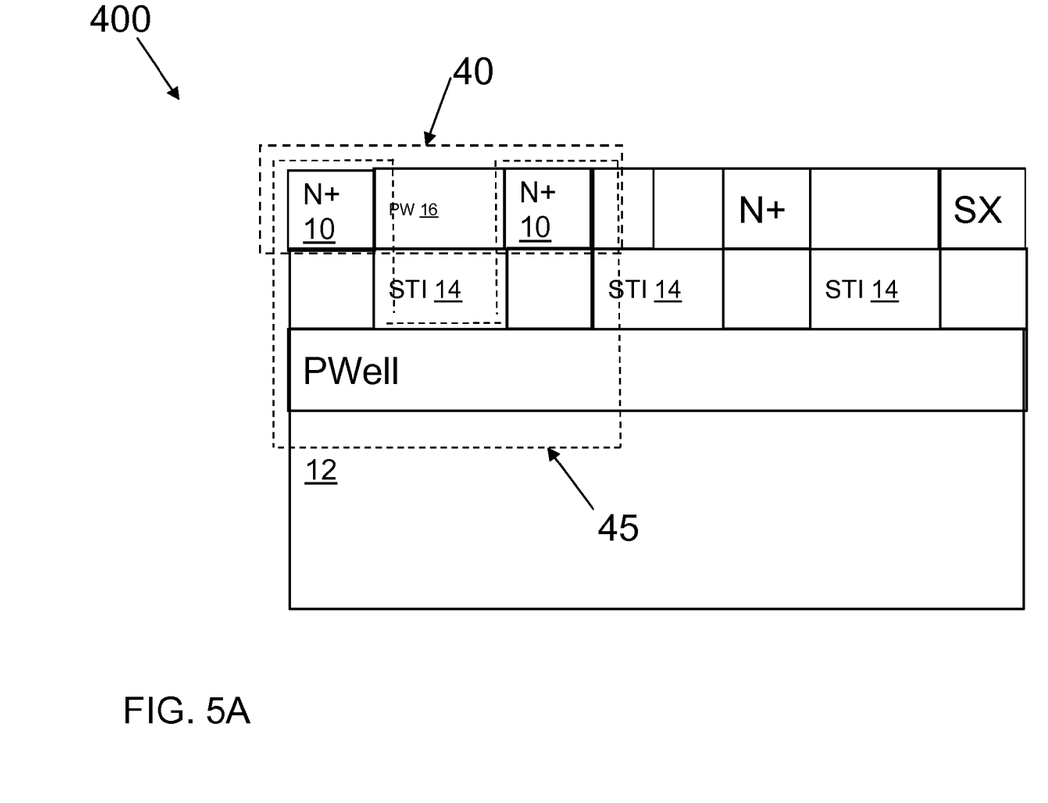
FIG. 5A shows a cross-sectional view of a fin field effect transistor including at least one ESD device according to embodiments of the invention.
Figure 5B:
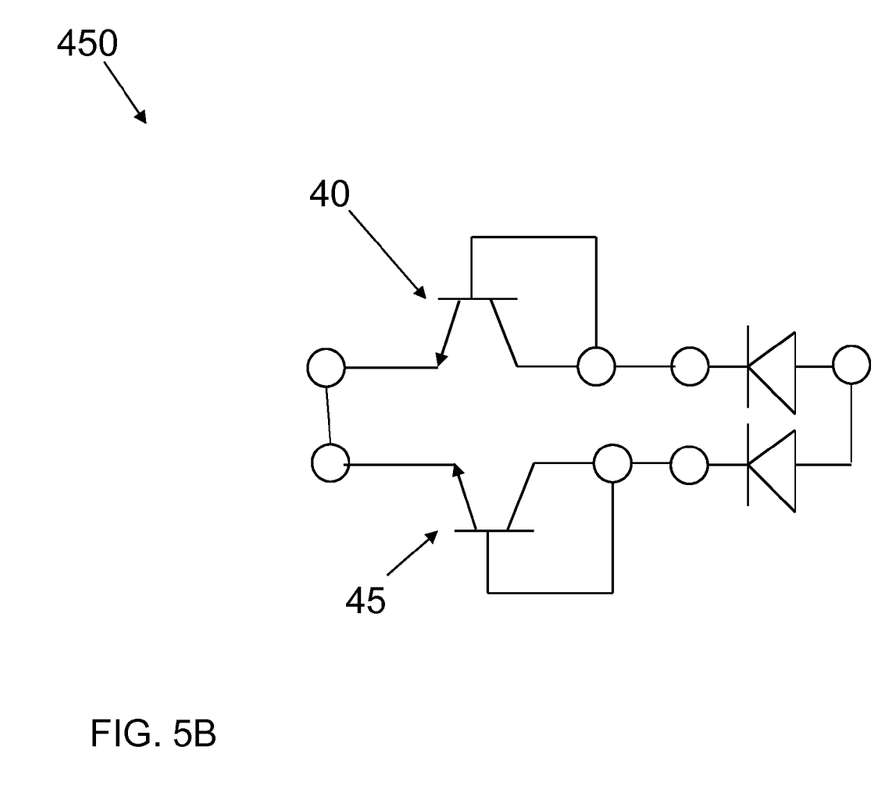
FIG. 5B shows a schematic diagram of a fin field effect transistor including at least one ESD device according to embodiments of the invention.

Turning now to FIG. 5A, a cross-sectional view of a Fin-FET 400 including at least one ESD device according to embodiments of the invention is shown. It is understood that only the planar surface 18 (FIG. 2) portion of FinFET 400 is shown for clarity purposes. That is, fins 10 are implanted to be an n+ region, and silicon portion 16 that merges fins 10 together is implanted as a PW region. In this embodiment, FinFET 400 also includes a dual ESD protection device. A first ESD protection device 40 is positioned above the STI region 14. For example, in FIG. 4A, the first ESD device 40 is a lateral device and is a lateral npn transistor formed by a npn junction (from the n+ region to the PW region to the n+ region). A second ESD device 45 is provided below the STI region 14 and is also a lateral npn transistor formed by a npn junction (from the n+ region to the PWell region to the n+ region). As seen in the schematic diagram of FinFET 400 shown in FIG. 4B, a dual ESD protection device 350 is formed by the first ESD device 40 and the second ESD device 45.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of manufacturing a dual ESD protection device in fin field effect transistor (FinFET) process technology, the method comprising:
   providing a bulk silicon wafer substrate;
   forming a plurality of fins on a top portion of the bulk silicon wafer substrate;
   forming an oxide isolation region between each of the fins, the oxide isolation region including a shallow trench isolation (STI);
   performing a selective epitaxial growth process to merge a portion of the plurality of fins; and
   patterning, etching, and implanting the portion of the plurality of fins to form the dual ESD protection device including: a first ESD device positioned above the oxide isolation region; and a second ESD device positioned below the oxide isolation region, wherein the first ESD device conducts current above the STI region and the second ESD device conducts current below the oxide isolation region.

2. The method of claim 1, wherein the first and second ESD devices include diodes.

3. The method of claim 2, wherein the implanting forms a pn junction for the first ESD device.

4. The method of claim 2, wherein the implanting forms a pn junction for the second ESD device.

5. The method of claim 1, wherein the first and second ESD devices include thyristors.

6. The method of claim 5, wherein the implanting forms a pnpn junction for the first ESD device.

7. The method of claim 5, wherein the implanting forms two pn junctions for the second ESD device.

8. The method of claim 1, wherein the first and second ESD devices include lateral npn transistors.

9. The method of claim 8, wherein the implanting forms a npn junction for the first ESD device.

10. The method of claim 8, wherein the implanting forms a npn junction for the second ESD device.

* * * * *